United States Patent [19]

Das

[11] Patent Number: 4,877,480
[45] Date of Patent: Oct. 31, 1989

[54] LITHOGRAPHIC TECHNIQUE USING LASER FOR FABRICATION OF ELECTRONIC COMPONENTS AND THE LIKE

[75] Inventor: Shyam Das, Acton, Mass.

[73] Assignee: Digital Equipment Corporation, Maynard, Mass.

[21] Appl. No.: 205,490

[22] Filed: Jun. 6, 1988

Related U.S. Application Data

[63] Continuation of Ser. No. 894,784, Aug. 8, 1986, abandoned.

[51] Int. Cl.⁴ ................................................ B44C 1/22
[52] U.S. Cl. ..................................... 156/635; 156/643; 156/659.1; 430/323; 430/945; 219/121.67; 219/121.84
[58] Field of Search ............... 430/297, 323, 324, 945; 219/121.68, 121.69, 121.84; 156/635, 643, 659.1; 427/53.1

[56] References Cited

U.S. PATENT DOCUMENTS

| | | | |
|---|---|---|---|
| 3,991,296 | 11/1976 | Kojima et al. | 219/121 LH |
| 4,108,659 | 8/1978 | Dini | 219/121 |
| 4,644,130 | 2/1987 | Bachmann | 219/121 LJ |

FOREIGN PATENT DOCUMENTS

| | | | |
|---|---|---|---|
| 55-82780 | 6/1980 | Japan . | |
| 34789 | 8/1984 | Japan | 156/635 |
| 61-95792 | 5/1986 | Japan . | |
| 61-188713 | 8/1986 | Japan . | |

Primary Examiner—José G. Dees
Attorney, Agent, or Firm—Fish & Richardson

[57] ABSTRACT

A microlithographic process of fabricating electronic components, such as, for example, integrated circuit chips and thin film read/write heads for computer disk systems, in which a laser is used to etch features defined by a mask. The laser is selected whose radiation will be absorbed by the workpiece being etched, and the masking material is selected so as to be highly reflective of the laser radiation. The masking material is patterned in a conventional manner so as to expose the portions of the workpiece material to be etched. When the laser is directed to the workpiece, the laser radiation etches the portions of the workpiece not protected by the mask.

The depth of the recess formed by the laser can be limited by depositing an etch stop layer of reflective The depth of the recess formed by the laser can be limited by depositing an etch stop layer of reflective material on a substrate, followed by an intermediate layer of workpiece material to be etched, and then the reflective mask. The laser radiation etches the intermediate layer through the mask to the etch stop layer, which prevents radiation from etching the workpiece further.

Depending on the material being etched, the etch may be improved if performed under a liquid transparent to the laser radiation. The liquid may carry away the products produced by the etch.

9 Claims, 1 Drawing Sheet

LITHOGRAPHIC TECHNIQUE USING LASER FOR FABRICATION OF ELECTRONIC COMPONENTS AND THE LIKE

This is a continuation of co-pending application Ser. No. 894,784 filed on Aug. 8, 1986, abandoned.

BACKGROUND OF THE INVENTION

1. Field of the Invention

The invention relates generally to the field of lithographic processing techniques and more specifically to techniques using lasers for fabrication of electronic devices using lithography. The inventive laser techniques are particularly useful in fabricating such components as thin-film magnetic read/write heads for magnetic storage devices for digital data processing systems.

2. Description of the Prior Art

Microlithographic techniques have been advantageously used for a number of years in the fabrication of a number of types of electronic equipment. Such techniques are used, for example, in semiconductor processing, and more recently have been applied to the manufacture of read/write heads used in disk mass data storage units.

In microlithograph fabrication of electronic components, a workpiece, such as a substance in the case of semiconductor processing, is first formed. Lithographic techniques are then used to form the various circuit and other features in the workpiece. In such techniques, various layers of material are deposited and the features are outlined therein by means of a photoresistive material ("photoresist") that is applied and patterned in a well-known manner. After the photoresist is patterned, portions of the workpiece or selected layers under the regions not covered by the masks are removed by chemical or ion beam etching. This procedure is typically repeated a number of times to form the final device.

A number of problems arise, however, in both chemical and ion beam etching. In chemical etching, the chemicals that are used to perform the etch not only remove the unprotected material from the unmasked areas, they also tend to undercut, at least slightly, the portions of the workpiece directly under the edges of the masked areas. This occurs because, as the etching chemicals remove the unmasked material, the sidewalls of the regions directly under the masks are exposed to the chemicals, which also are etched. This undercutting limits the size of the features that can be formed in the device. In particular, in designing a device, the designer must take into account the degree of undercutting that would be expected during device fabrication when he is determining how close features can be and the minimum widths of the features.

With ion beam etching, the ion beam which performs the etch is unidirectional. Accordingly, if the ion beam is directed perpendicular to the surface of the workpiece, undercutting does not occur. However, current ion beam etching techniques use a broad ion beam which is applied to the entire workpiece, rather than to a specific portion of the workpiece. As a result, the ion beam not only removes material that is not masked, it also cuts into at least the masking material itself. Accordingly, care must be taken to ensure that the masks are thick enough so that all of the unmasked material that is to be removed is in fact removed before the mask itself is completely etched away. The mask cannot be arbitrarily thin; it must be at least thick enough so that it is not etched away before the portions of the underlying layer to be etched have been etched to the required depth. Furthermore, if the mask it too thick, it will limit the minimum feature size on the workpiece.

Another problem with ion beam etching techniques is that they use energetic particles, such as atoms or ions, which are applied to the entire workpiece. When the entire workpiece is so exposed to the energetic particles, it experiences a temperature increase and heat build-up which is undesirable for such devices as the magnetic read/write heads. Furthermore, with ion beams etching, often some small amount of the material initially removed from the workpiece is redeposited elsewhere on the workpiece, which can limit the feature resolution size possible with the technique, and can also interfere with proper operation of the device in some circumstances.

Heretofore, lasers have also been used to etch certain difficult to etch workpiece materials such as ceramics and certain polymers, and also in trimming such circuit elements as thin film resistors. In the existing laser techniques, the laser beam is focussed to a tiny spot, which is directed onto the surface of a workpiece. The spot is moved over the surface of the workpiece to remove the unwanted material. This eliminates the need for masking, but it has at least several drawbacks. For example, in laser etching the size of the spot is a lower bound on the size of the features that can be formed in the workpiece, and so for a very small or arbitrarily-shaped feature sophisticated optical elements would be needed. Furthermore, since in the conventional laser technique only one feature is formed at a time, more time would be required than if the laser could operate on the entire surface of the workpiece at one time.

With all three techniques, it is also difficult, once etching begins, to stop the etch to ensure that recesses are formed which have predetermined depths that are fairly precisely defined. The depth of an etched recess varies not only with the time the etch is applied, but also with the characteristics of the materials being etched, and as between various production runs even of nominally the same materials, variations in the materials will result in variations in the depths of the recesses.

SUMMARY OF THE INVENTION

The invention provides a new and improved laser lithographic technique for etching a workpiece. In the new technique, a mask of a material that is highly reflective in the wavelengths of the laser to be used is placed on the surface of the workpiece by conventional techniques. The laser radiation is then applied to the masked surface of the workpiece to remove the unmasked material. The laser radiation is applied uniformly over an area of the workpiece that is large compared to the size of a feature to be formed thereon. The reflective material reflects the laser radiation from the areas that are not to be removed.

In this new method, much of the applied energy is not absorbed by the workpiece, but instead is either reflected by the mask or used to vaporize unmasked material. Accordingly, the portions of the workpiece that are covered by the reflective mask, that are not to be etched, stay at close to ambient temperature. This minimizes the detrimental effects of heat build-up which are mentioned above.

To form a recess of a preselected depth in the surface of a workpiece, the workpiece is formed in which a layer of reflective material is first deposited on a substance, and another layer of non-reflective material, in which the recess is to be formed, is deposited over the top of the reflective material. A mask which is patterned to define the sidewalls of the recess is then placed on the surface of the workpiece, that is, over the top of the deposited non-reflective material. Laser radiation is then applied to the upper surface of the workpiece, which removes the exposed non-reflective material. The lower layer of reflective material forms the lower limit of the recess formed by this process.

In a variation of this process, a liquid may be applied to the surface of the workpiece to be etched during the etching process. Preferably, the liquid selected does not absorb the laser radiation. The liquid assists in removing the material vaporized by the laser so that the process may proceed faster and more cleanly, and also provides other advantages such as cooling the workpiece to avoid thermal stresses in the etched areas. In addition, if a liquid is selected which reacts with the material of the workpiece in the etched areas at the high temperatures that are produced by the laser, a finer etch resolution may be obtained. In a variation, instead of placing the liquid only over the surface of the workpiece to be etched, the workpiece may be partially or entirely submerged in a bath of the liquid.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

FIG. 1, comprising

DETAILED DESCRIPTION OF AN ILLUSTRATIVE EMBODIMENT

Figure 1A:
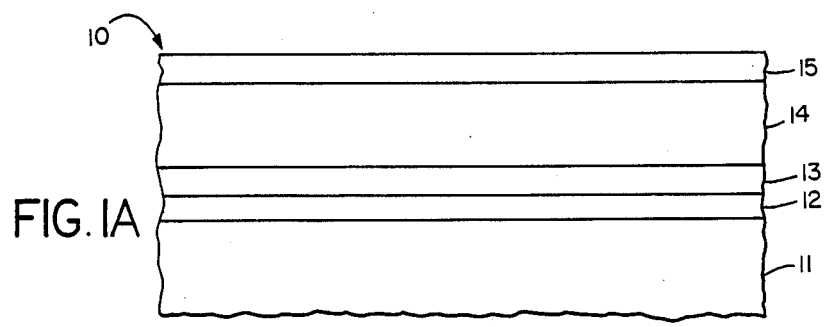
FIGS. 1A through 1C, depict the new laser lithography technique in accordance with the invention.

With reference to the FIGS. FIG. 1A depicts a workpiece 10 which may be used in connection with the new laser lithographic techniques. The workpiece includes a substrate 11 on which prior processing may have been performed before the laser processing technique described herein has begun. In the workpiece 10 depicted on FIG. 1, prior processing has been performed to deposit a layer 12 on top of substance 11. In addition, in previous processing, various features and electronic circuit elements which are not specifically shown in FIG. 1 may have been formed in substrate 11 and layer 12 by means of conventional processes which form no part of the invention.

Figure 1B:
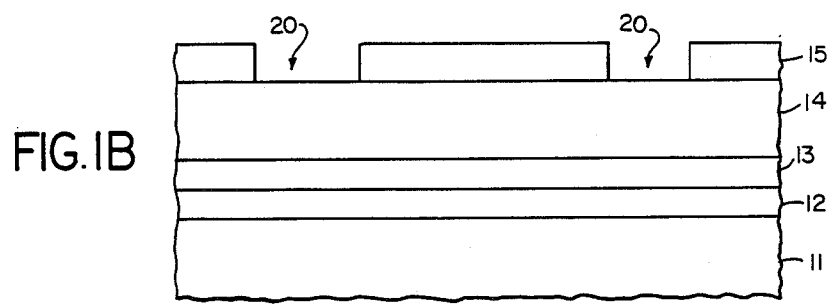

In accordance with the invention, a layer 13 is initially deposited on the layer 12, a third layer 14 in which a recess is to be formed by means of laser radiation (represented by downwardly-going arrows 16) is then deposited on layer 13, and a top layer 15 is then formed over layer 14. Layer 15 is patterned to form openings 20 (FIG. 1B) in the layer, which serves to expose portions of underlying layer 14. The layer 15 can be patterned by, for example, conventional photolithographic techniques using chemical or ion beam etch procedures. The openings 20 are provided to define the sidewall boundaries of the recesses which are to be formed in underlying layer 14. Two such openings 20 are depicted in FIG. 1B. The openings may be of any arbitrary shape.

Figure 1C:
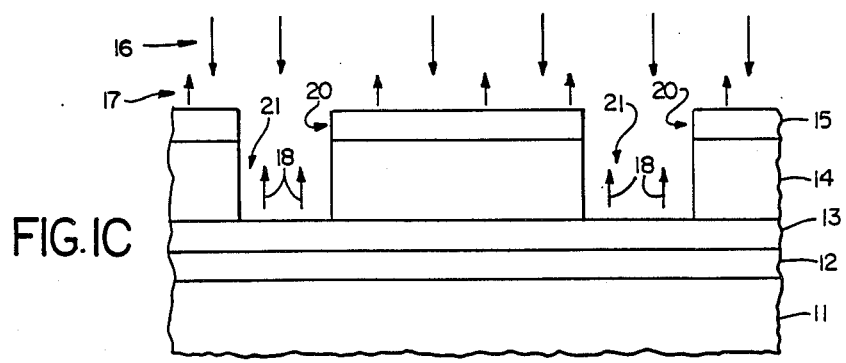

The laser which will be used is selected so that the materials which comprise layers 13 and 15 are highly reflective at the wavelength of the laser radiation. The material which comprises layer 14 is selected to have low reflectivity, and also low transmissivity, at the wavelength of the laser radiation. As shown in FIG. 1C, since layer 15 is highly reflective at the wavelengths of the incident laser radiation 16, layer 15 reflects laser radiation as represented by arrows 17 and thus is not effected by the radiation. However, layer 14 does not reflect the radiation, thus the regions exposed by openings 20 absorb the radiation and are effectively vaporized thereby and thus removed to form recesses 21. The removal of the exposed portions of layer 14 continues until the underlying portions of reflective layer 13 are exposed. Layer 13, like layer 15, reflects the laser radiation, as represented by arrows 18, and is also unaffected thereby.

Thus, the pattern of layer 15 determines the shape (as viewed from a direction orthogonal to the exposed surface of layer 15) of the recess in layer 14, and layer 13 effectively serves to determine the maximum depth of the recess in the workpiece by preventing laser radiation from impinging on layer 12. Accordingly, it is apparent that the recess will not extend into layer 12 or substrate 11.

While the pattern of layer 15 has been described as being formed in situ, that is, while layer 15 has been in place on the workpiece, it will be appreciated by those skilled in the art that layer 15 may comprise a mask which has been patterned prior to being placed on layer 14.

It will be appreciated that in certain circumstances it may be undesirable for the etch-stop layer 13 to extend throughout the entire workpiece 10. For example, if copper is selected as the layer 13, and if layer 13 extends throughout the workpiece, the copper would act as an electrical conductor throughout the entire workpiece. If the workpiece is to have electrical connections through the openings 21 in layer 14, it would clearly be undesirable for layer 13 to extend to all of the openings. Thus, it may be necessary to also pattern etch-stop layer 13 so that the layer effectively complements the openings in layer 15. This would suffice to eliminate electrical conduction paths through layer 13 between the openings 21.

The materials selected for layers 13, 14 and 15 depend upon the laser to be used in the process, or alternatively, the laser selected for use in the process depends on the types of materials which may be required for the workpiece. In one particular example, the substrate 11 may comprise a high density ceramic substrate having about seventy percent alumina ($Al_2O_3$) and thirty percent titanium carbide, and layer 12 may comprise alumina, and it is desired to produce a recess in a layer 14 also comprised of alumina.

Continuing with the aforementioned example, a carbon dioxide ($CO_2$) laser may effectively be used since the absorption by alumina of the carbon dioxide laser radiation is very high; that is, the alumina comprising layer 14 readily absorbs radiation in the wavelengths emitted by the carbon dioxide laser, and thus the exposed areas of layer 14 will effectively be evaporated by the laser. Suitable material for layers 13 and 15 in that example are copper and gold, both of which reflect on the order of ninety-eight percent of radiation in the wavelengths produced by carbon dioxide lasers. In one particular example, layer 13 may be gold and layer 15 may be copper, with both materials being deposited on the respective underlying layers by means of sputtering, and with the copper layer 15 being easily patterned by means of ion beam or chemical etching techniques.

It will be appreciated that this method provides a number of benefits over conventional etching methods. In particular, the laser etching typically removes unwanted material much faster than can be achieved by means of chemical etching techniques and with none of the undercutting problems that are present. The new laser technique may cause some minor deformations due to thermal energy being conducted in the vicinity of the openings in the workpiece outside of the region being removed, and further to resolidification of some of the melted material, but these can be minimized as explained later.

The new laser etching technique does not rely on differential etch rates between the masking material and the material to be etched, as do ion beam etching techniques. Accordingly, the minimum thickness of the mask used in the laser technique is not related to the thickness of the recess to be etched, as is the case in connection with ion beam techniques. The reflective layers used in the laser etching technique must be of sufficient thickness to be reflective over the surface of the workpiece in the areas not to be etched.

Furthermore, the new laser etching technique does not require focusing of the laser beam to a small spot and moving it over the surface of the workpiece to define the required features, as is necessary in present laser etching techniques. Thus, the sophisticated optical systems characteristic of present laser techniques are not required in the new technique. In addition, the minimum feature size is not related to the size of the laser spot, and the workpiece can be processed at one time since the new technique allows the entire surface of the workpiece to be processed at one time.

As has been noted, recesses formed by the the new laser lithographic technique may be slightly deformed due to heating of the workpiece outside the region being removed, and also due to resolidification of material which was heated by the laser but not evaporated, which could limit the resolution of the work. In addition, some metal and ceramic materials may deform and some ceramic materials may crack under intense laser radiation. However, these problems can be minimized by immersing the workpiece in a liquid, or providing a layer of liquid over the irradiated surface of the workpiece, while the laser is irradiating the surface. The liquid can act both to cool the workpiece and, depending on the nature of the liquid, may also either dissolve, by chemical action, or flush away, by mechanical action, debris that is thrown up from the workpiece while the laser is entrained thereon.

As will be appreciated by one skilled in the art, the selection of a suitable liquid will depend on a number of factors. In particular, a suitable liquid should be fairly transparent to the laser radiation and should not react with the masking material (that is, layers 13 and 15 in FIG. 1). It is also preferable that, if the liquid reacts with the material being etched (that is, layer 14 in FIG. 1) at all, it should react only very slowly at room temperature, so that the workpiece itself not be etched by the liquid outside of the area on which the laser beam is impinging.

If the liquid reacts with the material to be etched at elevated temperatures, which would be present at the areas illuminated by the laser radiation, it may assist the etch operation, effectively performing a chemical etch on the material in the area being struck by the laser. Since the temperature of the portions of the material that do not directly receive laser radiation will not be increased as much as the portions that do, they will not be etched as much by the liquid. The resulting etch by the liquid, which is effectively a chemical etch, would be more anisotropic than is a conventional chemical etch.

EXAMPLES

Example No. 1

Etching of Alumina by $CO_2$ Laser

An alumina layer was formed on a substrate, and a 200 Angstrom layer of chromium was deposited by sputtering. The chromium later was provided to act as an adhesion layer for the next layer, which was gold (alternatively, copper could have been used). The gold layer, which served as layer 13 (FIG. 1) was one-half micron thick. A sheet of alumina approximately thirty to forty microns thick was then deposited by sputtering to form layer 14, and a three-tenths to five-tenths micron thick layer of copper (alternatively gold could have been used) was sputtered as layer 15.

The copper layer (15) was then patterned by conventional photolithographic techniques. In one case, a layer of photoresist was deposited on top of the copper layer and patterned in a conventional manner exposing a pattern of the copper layer underneath. The exposed copper was etched by an ion beam etch and any photoresist was dissolved in a developer. This leaves the openings (20, FIG. 1) exposing alumina in layer 14.

In another case, the copper layer 15 was patterned using a conventional lift-off technique. In that technique, the photoresist layer was deposited before the copper layer (the photoresist layer is not shown in FIG. 1) and a pattern in the photoresist was exposed in a conventional photolithography step. A thin copper layer was then sputter deposited on top of the photoresist, and the patterned photoresist was dissolved in a developer. The dissolving photoresist took with it the copper directly on top, leaving the copper in the desired pattern.

After the copper layer 15 was patterned, the workpiece was covered by a thin film of methylene chloride liquid and irradiated using a pulsed carbon dioxide laser to etch the exposed alumina. The energy supplied by the laser was about four Joules per laser pulse at four to ten pulses per second over an area of approximately one-fourth square inch.

Example No. 2

Etching Using A Removable Mask

In this example, the mask comprising layer 15 was not deposited onto the workpiece, but instead was formed separately and placed onto the surface of the workpiece to be etched. A workpiece was formed of alumina. A base mask was formed of generally planar nickel, with openings through which the workpiece could be exposed. The mask had a thickness of about fifteen microns in the areas adjacent the openings, and elsewhere a thickness of about 125 microns, the thick portion providing mechanical sturdiness while the thin portion allowed for better resolution in alignment of the mask over the workpiece. To prevent chemical interaction between the mask and a liquid which might be used, the mask was plated with a ten micron layer of gold. The mask was then aligned with the workpiece and both were clamped together in a fixture. Methylene chloride liquid was then sprayed onto the fixture to form a uniform thin layer on the surface which would receive the laser radiation.

The workpiece was then illuminated by a $CO_2$ laser. To increase the energy per unit area of the laser (which had about four Joules per pulse), the laser beam was focused to a size of about one-fourth inch by one inch by means of lenses, and the workpiece was moved under the laser beam at a rate of six-thousandths of an inch per second until the entire surface of the workpiece had been exposed through the mask. The process was repeated twenty times to form recesses in the alumina having a depth of approximately thirty-five microns.

After the process was concluded, the mask was removed from the workpiece by unclamping the fixture. The mask could be used in a subsequent etching process.

Example No. 3

Etching of High-Density Ceramic

A workpiece was fabricated of high-density ceramic having a patterned layer of copper to define the pattern to be etched. Carbon dioxide, ruby and Nd:YAG lasers were used to perform the etch. When the etch was performed in air, that is, when no liquid was present, small cracks developed in the ceramic and some ceramic debris from the etch resolidified.

In other trials using high-density ceramic, several liquids were used, including methylene chloride and a solution of potassium hydroxide in water. The potassium hydroxide solution was generally satisfactory for the Nd:YAG and ruby lasers, even though for some depths of liquid it absorbed about thirty-five percent of the radiation of the Nd:YAG laser. The preferred concentration of the potassium hydroxide was on the order of twelve normal (12N) of above; trial etches in solutions having concentrations of on the order of six normal or less exhibited some cracking of the ceramic.

Example No. 4

Etching of Permalloy

A workpiece was prepared comprising an Alsimag substrate on which a three thousand Angstrom thick layer of aluminum was deposited by sputtering. The aluminum served as an etch-stop layer. A two thousand Angstrom thick layer of permalloy was then plated onto the aluminum sheet. An aluminum mask was formed on the permalloy layer using a lift-off technique. The workpiece was then irradiated, in air, with a krypton fluoride laser. The permalloy was etched without affecting the aluminum mask or the etch-stop layer.

In another trial, a solution of dilute nitric acid with small amounts of potassium dichromate was used. The resulting etch had less resolidification of molten permalloy than had occurred in the etch without the liquid.

Example No. 5

Etching of Polymer

A thin film of copper was deposited on a silicon substrate as an etch-stop layer (13, FIG. 1). A layer of photoresist was deposited on the copper layer and baked hard. A portion of the photoresist layer was exposed to ruby laser radiation through a hole in a removable stainless steel mask. The laser beam had an effective diameter of about 3 millimeters, and the hole in the mask had a diameter of about 40 microns. The portion of the photoresist struck by the laser was effectively decomposed into volatile parts, and so no resolidification occurred. The copper effectively stopped the etch, but was somewhat deformed by the high energy of the ruby laser radiation.

The foregoing description has been limited to specific embodiments of this invention. It will be apparent, however, that variations and modifications may be made to the process, with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. A process of etching a recess in a workpiece using laser radiation through a patterned mask defining the boundaries of the recess, wherein the improvement comprises using as the material comprising the mask a material that is reflective at the wavelengths of the laser radiation; providing a layer of liquid over the surface of the mask, the liquid selected to be substantially transparent to the radiation of the laser to be used and substantially non-reactive to the materials forming the workpiece at room temperature, and reactive to the materials forming the workpiece, except the material comprising the mask, at elevated temperatures produced by the laser radiation; and exposing the workpiece to laser radiation to remove material from the exposed portions for a time sufficient to produce a recess of the desired depth, the reflective mask preventing the portions covered thereby from being etched by the laser radiation.

2. A process as defined in claim 1 wherein the improvement further comprises:
   A. forming over the workpiece an etch stop layer of material that is reflective at the wavelengths of the laser radiation prior to forming the mask, said etch stop layer being formed at least in the areas of the workpiece that are complementary to the pattern to be formed in the mask;
   B. depositing a layer of material to be etched; and
   C. thereafter forming the mask and exposing the workpiece to the laser radiation, the laser etching the portions of the material to be etched that are exposed through the mask, the etch stop layer serving to stop the laser radiation from penetrating into the workpiece beyond the etch stop layer to thereby limit the depth of the recess.

3. A process of etching a recess in a workpiece using a laser radiation comprising the steps of:
   A. depositing over the workpiece a covering layer of masking material that is reflective at the wavelengths of the laser radiation;
   B. patterning the reflective covering layer to form a mask to expose the portions of the workpiece under the reflective covering layer in which the recess is to be formed;
   C. providing a layer of liquid over the surface of the mask, the liquid selected to be substantially transparent to the radiation of the laser to be used, and as substantially non-reactive to the materials forming the workpiece at room temperature, and reactive to the radiation exposed etch materials forming the workpiece, at elevated temperatures produced by the laser radiation; and
   D. exposing the workpiece to laser radiation through the mask to remove material from the exposed portions for a time sufficient to produce a recess of the desired depth, the mask preventing the portions covered thereby from being etched by the laser radiation.

4. A process as defined in claim 3 further comprising the steps of:
   A. forming over the workpiece an etch stop layer of material that is reflective at the wavelengths of the laser radiation prior to exposing the workpiece to the laser radiation, said etch stop layer being formed at least in the areas of the workpiece that are complementary to the pattern to be formed in the mask;
   B. depositing a layer of material to be etched; and
   C. thereafter depositing the covering layer of masking material and exposing the workpiece to the laser radiation, the laser etching the portions of the material to be etched that are exposed through the mask, the etch stop layer serving to stop the laser radiation from penetrating into the workpiece beyond the etch stop layer to thereby limit the depth of the recess.

5. A process of etching a recess in a workpiece using laser radiation comprising the steps of:
   A. forming over a first portion of the workpiece an etch stop layer of material that is reflective at the wavelengths of the laser radiation;
   B. depositing a second portion of the workpiece, comprising a layer of material to be etched, over the etch stop layer;
   C. locating a reflective mask that is reflective at the wavelengths of the laser radiation over the layer of material to be etched; and
   D. applying laser radiation through the mask to the layer of material to be etched to remove material from the exposed regions for a time sufficient to produce a recess of a desired depth, the etch stop layer serving to stop the laser radiation from penetrating into the first portion of the workpiece beyond the etch stop layer to thereby limit the depth of the recess, and the mask preventing the regions of the second portion of the workpiece covered thereby from being etched by the laser radiation.

6. A process as defined in claim 5 in which the mask locating step comprises the step of
   A. depositing over the workpiece a covering layer of material that is reflective at the wavelengths of the laser radiation; and
   B. patterning the reflective covering layer to form a mask to expose the portions of the workpiece under the reflective covering layer in which the recess is to be formed.

7. A process as defined in claim 5 further comprising the step of providing a layer of liquid over the surface of the mask, the liquid selected to be substantially transparent to the radiation of the laser to be used, prior to exposing the workpiece to radiation.

8. A process as defined in claim 7 wherein the liquid is further selected as substantially non-reactive to the materials forming the workpiece at room temperature, and reactive to the radiation exposed etch materials forming the workpiece at elevated temperatures produced by the laser radiation.

9. A process of etching a recess in a workpiece using a laser radiation, comprising the steps of:
   A. forming over the workpiece an etch stop layer of material that is reflective at the wavelengths of the laser radiation;
   B. depositing a layer of material to be etched;
   C. locating a reflective mask over the layer of material that is reflective at the wavelengths of the laser radiation;
   D. providing a layer of liquid over the surface of the mask, the liquid being selected to be substantially transparent to the radiation of the laser to be used and substantially non-reactive to the materials forming the workpiece at room temperature, and reactive to the radiation exposed etch materials forming the workpiece at elevated temperatures produced by the laser radiation; and
   E. applying laser radiation through the mask to the layer to be etched to remove material from the exposed portions for a time sufficient to produce a recess of a desired depth, the etch stop layer serving to stop the laser radiation from penetrating into the workpiece beyond the etch stop layer to thereby limit the depth of the recess, and the mask preventing the portions covered thereby from being etched by the laser radiation.

* * * * *

UNITED STATES PATENT AND TRADEMARK OFFICE
CERTIFICATE OF CORRECTION

PATENT NO. : 4,877,480
DATED : October 31, 1989
INVENTOR(S) : Shyam Das

It is certified that error appears in the above-identified patent and that said Letters Patent is hereby corrected as shown below:

Column 1, line 27, "substance" should be --substrate--.

Column 2, line 13, "beams" should be --beam--.

Column 3, lines 1-2, "substance" should be --substrate--.

Column 5, line 14, "later" should be --below--.

Column 7, line 37, "of" (second occurrence) should be --or--.

Column 10, claim 9, line 20, delete "a".

In the Abstract: delete "The depth of the recess formed by the laser can be limited by depositing an etch stop layer of reflective". (first occurrence)

Signed and Sealed this

Twenty-sixth Day of May, 1992

Attest:

DOUGLAS B. COMER

Attesting Officer

Acting Commissioner of Patents and Trademarks